United States Patent
Liu et al.

(10) Patent No.: US 12,299,288 B2
(45) Date of Patent: May 13, 2025

(54) METHOD FOR RECOVERY IN READ OPERATION OF MEMORY DEVICE AND MEMORY DEVICE THEREOF

(71) Applicant: YANGTZE MEMORY TECHNOLOGIES CO., LTD., Wuhan (CN)

(72) Inventors: Shuang Liu, Wuhan (CN); Ling Chu, Wuhan (CN); Manxi Wang, Wuhan (CN); Sanshan Jiao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 41 days.

(21) Appl. No.: 18/203,942

(22) Filed: May 31, 2023

(65) Prior Publication Data

US 2024/0220125 A1  Jul. 4, 2024

Related U.S. Application Data

(63) Continuation of application No. PCT/CN2023/081098, filed on Mar. 13, 2023.

(60) Provisional application No. 63/436,433, filed on Dec. 30, 2022.

(51) Int. Cl.
*G06F 12/00* (2006.01)
*G06F 3/06* (2006.01)

(52) U.S. Cl.
CPC .......... *G06F 3/0613* (2013.01); *G06F 3/0659* (2013.01); *G06F 3/0679* (2013.01)

(58) Field of Classification Search
CPC ..... G06F 3/0613; G06F 3/0659; G06F 3/0679
USPC .......................................................... 711/154
See application file for complete search history.

(56) References Cited

U.S. PATENT DOCUMENTS

| | | |
|---|---|---|
| 2016/0247578 A1 | 8/2016 | Yun |
| 2021/0020254 A1 | 1/2021 | Kim et al. |
| 2021/0174852 A1* | 6/2021 | Li ................... G11C 16/0483 |
| 2022/0020438 A1 | 1/2022 | Seo et al. |
| 2022/0051714 A1 | 2/2022 | Bang et al. |
| 2022/0392536 A1* | 12/2022 | Wan ................ G11C 16/0483 |
| 2023/0195324 A1* | 6/2023 | Lee ...................... G06F 3/0653 |
| | | 711/103 |

OTHER PUBLICATIONS

International Search Report issued in corresponding International Application No. PCT/CN2023/081098 mailed Jun. 23, 2023, 3 pages.

* cited by examiner

*Primary Examiner* — Mardochee Chery
(74) *Attorney, Agent, or Firm* — BAYES PLLC

(57) ABSTRACT

In certain aspects, a memory device includes an array of memory cells, word lines respectively coupled to rows of the memory cells, and a peripheral circuit coupled to the array of memory cells through the word lines and configured to read a select row of the rows of the memory cells. The peripheral circuit includes a word line driver coupled to the select row through a select word line of the word lines and to an unselect row of the rows of the memory cells through an unselect word line of the word lines, and configured to apply a pass voltage to the unselect word line, and discharge the unselect word line from the pass voltage to a first recovery voltage that is greater than a supply voltage of the array of memory cells.

20 Claims, 13 Drawing Sheets

METHOD FOR RECOVERY IN READ OPERATION OF MEMORY DEVICE AND MEMORY DEVICE THEREOF

CROSS-REFERENCE TO RELATED APPLICATIONS

This application is a continuation of International Application No. PCT/CN2023/081098, filed on Mar. 13, 2023, entitled "MEMORY DEVICE AND READ OPERATION THEREOF," which claims the benefit of priority to U.S. Provisional Application No. 63/436,433, filed on Dec. 30, 2022, both of which are incorporated herein by reference in their entireties.

BACKGROUND

The present disclosure relates to memory devices and operation methods thereof.

Flash memory is a low-cost, high-density, non-volatile solid-state storage medium that can be electrically erased and reprogrammed. Flash memory includes NOR Flash memory and NAND Flash memory. Various operations can be performed by Flash memory, such as read, program (write), and erase. For NAND Flash memory, an erase operation can be performed at the block level, and a program operation or a read operation can be performed at the page level.

SUMMARY

In one aspect, a memory device includes an array of memory cells, word lines respectively coupled to rows of the memory cells, and a peripheral circuit coupled to the array of memory cells through the word lines and configured to read a select row of the rows of the memory cells. The peripheral circuit includes a word line driver coupled to the select row through a select word line of the word lines and to an unselect row of the rows of the memory cells through an unselect word line of the word lines, and configured to apply a pass voltage to the unselect word line, and discharge the unselect word line from the pass voltage to a first recovery voltage that is greater than a supply voltage of the array of memory cells.

In some implementations, the word line driver is further configured to apply a read voltage to the select word line, and discharge the select word line from the read voltage to a second recovery voltage that is greater than the supply voltage.

In some implementations, the second recovery voltage is smaller than the first recovery voltage.

In some implementations, the unselect word line is immediately adjacent to the select word line.

In some implementations, the word line driver is configured to start discharging the select word line and the unselect word line at a same time.

In some implementations, the peripheral circuit further includes control logic coupled to the word line driver and configured to set a duration for the word line driver to discharge the unselect word line.

In some implementations, the peripheral circuit further includes control logic coupled to the word line driver and configured to set the first recovery voltage for the word line driver to discharge the unselect word line.

In some implementations, the memory device is a three-dimensional (3D) NAND memory device.

In another aspect, a method for reading a memory device is provided. The memory device includes memory cells. A pass voltage is applied to an unselect word line coupled to an unselect row of the memory cells. The unselect word line is discharged from the pass voltage to a first recovery voltage that is greater than a supply voltage of the memory cells.

In some implementations, a read voltage is applied to a select word line coupled to a select row of the memory cells, and the select word line is discharged from the read voltage to a second recovery voltage that is greater than the supply voltage.

In some implementations, the second recovery voltage is smaller than the first recovery voltage.

In some implementations, the unselect word line is immediately adjacent to the select word line.

In some implementations, discharging the select word line and discharging the unselect word line are started at a same time.

In some implementations, a duration is set to discharge the unselect word line.

In some implementations, the first recovery voltage is set to discharge the unselect word line.

In some implementations, the memory device is a 3D NAND memory device.

In still another aspect, a system includes a memory device configured to store data and a memory controller coupled to the memory device and configured to control the memory device. The memory device includes an array of memory cells, word lines respectively coupled to rows of the memory cells, and a peripheral circuit coupled to the array of memory cells through the word lines and configured to read a select row of the rows of the memory cells. The peripheral circuit includes a word line driver coupled to the select row through a select word line of the word lines and to an unselect row of the rows of the memory cells through an unselect word line of the word lines, and configured to apply a pass voltage to the unselect word line, and discharge the unselect word line from the pass voltage to a first recovery voltage that is greater than a supply voltage of the array of memory cells.

In some implementations, the word line driver is further configured to apply a read voltage to the select word line, and discharge the select word line from the read voltage to a second recovery voltage that is greater than the supply voltage.

In some implementations, the second recovery voltage is smaller than the first recovery voltage.

In some implementations, the unselect word line is immediately adjacent to the select word line.

In yet another aspect, a memory device includes an array of memory cells, word lines respectively coupled to rows of the memory cells, and a peripheral circuit coupled to the array of memory cells through the word lines and configured to read a select row of the rows of the memory cells. The peripheral circuit includes a word line driver coupled to the select row through a select word line of the word lines and to an unselect row of the rows of the memory cells through an unselect word line of the word lines, and configured to apply a first read voltage to the select word line, apply a second read voltage smaller than the first read voltage to the select word line immediately after applying the first read voltage, and apply a pass voltage to the unselect word line when applying the first read voltage to the select word line and when applying the second read voltage to the select word line.

In some implementations, the unselect word line is immediately adjacent to the select word line.

In yet another aspect, a method for reading a memory device is provided. The memory device includes memory cells. A first read voltage is applied to a select word line coupled to a select row of the memory cells. A second read voltage smaller than the first read voltage is applied to the select word line immediately after applying the first read voltage. A pass voltage is applied to an unselect word line when applying the first read voltage to the select word line and when applying the second read voltage to the select word line.

In some implementations, the unselect word line is immediately adjacent to the select word line.

In yet another aspect, a system includes a memory device configured to store data and a memory controller coupled to the memory device and configured to control the memory device. The memory device includes an array of memory cells, word lines respectively coupled to rows of the memory cells, and a peripheral circuit coupled to the array of memory cells through the word lines and configured to read a select row of the rows of the memory cells. The peripheral circuit includes a word line driver coupled to the select row through a select word line of the word lines and to an unselect row of the rows of the memory cells through an unselect word line of the word lines, and configured to apply a first read voltage to the select word line, apply a second read voltage smaller than the first read voltage to the select word line immediately after applying the first read voltage, and apply a pass voltage to the unselect word line when applying the first read voltage to the select word line and when applying the second read voltage to the select word line.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

The present disclosure will be described with reference to the accompanying drawings.

DETAILED DESCRIPTION

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Memory devices, such as NAND Flash memory devices, can store more than a single bit of information into each memory cell in multiple levels (a.k.a., states) in order to increase the storage capacity and reduce the cost per bit. As the storage capacity of each memory cell increases, the reliability of the stored data inevitably gets worse because more distinguished states are to be written in the same threshold voltage window. For example, during read operations, the charge between adjacent word lines may migrate, which can cause read disturbance and hurt data retention, thereby resulting in poor reliability of the memory devices.

To address one or more of the aforementioned issues, the present disclosure introduces a solution that shortens or even cancels the word line discharging/recovery phase at the end of read operations. From the device reliability perspective, the residual voltage on the word line after the read phase can be used to reduce or even prevent the charge migration (a.k.a. charge loss) between adjacent word lines, thereby reducing the read disturbance, as well as making the threshold voltage distribution more stable and enlarging the read windows. In the long term, the reduction of charge loss can also improve data retention of the memory devices. Moreover, by shortening or even cancelling the recovery phase for read operations, the efficiency of read operations can be improved as well.

Figure 1:
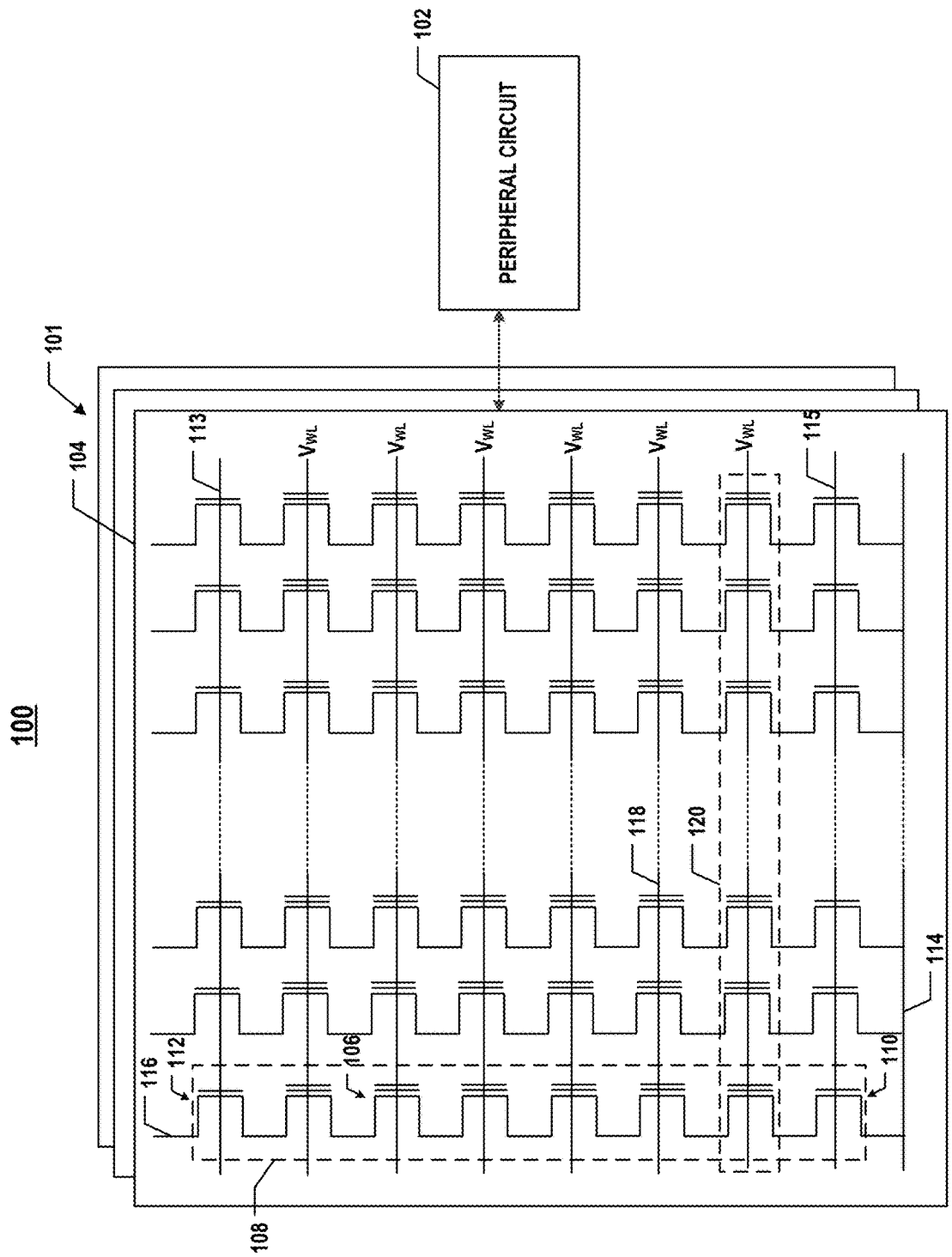
FIG. 1 illustrates a schematic diagram of a memory device including peripheral circuits, according to some aspects of the present disclosure.

FIG. 1 illustrates a schematic circuit diagram of a memory device 100 including peripheral circuits, according to some aspects of the present disclosure. Memory device 100 can include a memory cell array 101 and peripheral circuits 102 coupled to memory cell array 101. Memory cell array 101 can be a NAND Flash memory cell array in which memory cells 106 are provided in the form of an array of NAND memory strings 108 each extending vertically above a substrate (not shown). In some implementations, each NAND memory string 108 includes a plurality of memory cells 106 coupled in series and stacked vertically. Each memory cell 106 can hold a continuous, analog value, such as an electrical voltage or charge, which depends on the number of electrons trapped within a region of memory cell 106. Each memory cell 106 can be either a floating gate type of memory cell including a floating-gate transistor or a charge trap type of memory cell including a charge-trap transistor.

In some implementations, each memory cell 106 is a single level cell (SLC) that has two possible memory states (levels) and thus, can store one bit of data. For example, the first memory state "0" can correspond to a first range of threshold voltages, and the second memory state "1" can correspond to a second range of threshold voltages. In some implementations, each memory cell 106 is an xLC that is capable of storing more than a single bit of data in more than four memory states (levels). For example, the xLC may store two bits per cell (MLC), three bits per cell (TLC), or four bits per cell (QLC)). Each xLC can be programmed to assume a range of possible nominal storage values (i.e., corresponding to $2^N$ pieces of N-bits data). In one example, the MLC can be programmed to assume one of three possible programming levels from an erased state by writing one of three possible nominal storage values to the cell. A fourth nominal storage value can be used for the erased state.

As shown in FIG. 1, each NAND memory string 108 can also include a source select gate (SSG) transistor 110 at its source end and a drain select gate (DSG) transistor 112 at its drain end. SSG transistor 110 and DSG transistor 112 can be configured to activate select NAND memory strings 108 (columns of the array) during read and program operations. In some implementations, the sources of NAND memory strings 108 in the same block 104 are coupled through a same source line (SL) 114, e.g., a common SL. In other words, all NAND memory strings 108 in the same block 104 have an array common source (ACS), according to some implementations. The drain of each NAND memory string 108 is coupled to a respective bit line 116 from which data can be read or written via an output bus (not shown), according to some implementations. In some implementations, each NAND memory string 108 is configured to be selected or deselected by applying a select voltage or a deselect voltage to the gate of respective DSG transistor 112 through one or more DSG lines 113 and/or by applying a select voltage or a deselect voltage to the gate of respective SSG transistor 110 through one or more SSG lines 115.

As shown in FIG. 1, NAND memory strings 108 can be organized into multiple blocks 104, each of which can have a common source line 114, e.g., coupled to the ACS. In some implementations, each block 104 is the basic data unit for erase operations, i.e., all memory cells 106 on the same block 104 are erased at the same time. To erase memory cells 106 in a select block 104, source lines 114 coupled to select block 104 as well as unselect blocks 104 in the same plane as select block 104 can be biased with an erase voltage (Vers), such as a high positive bias voltage (e.g., 20 V or more). Memory cells 106 of adjacent NAND memory strings 108 can be coupled through word lines 118 that select which row of memory cells 106 is affected by read and program operations. In some implementations, each word line 118 is coupled to a page 120 of memory cells 106, which is the basic data unit for read and program operations. The size of one page 120 in bits can relate to the number of NAND memory strings 108 coupled by word line 118 in one block 104. Each word line 118 can include a plurality of control gates (gate electrodes) at each memory cell 106 in respective page 120 and a gate line coupling the control gates.

As shown in FIG. 1, memory cell array 101 can include an array of memory cells 106 in a plurality of rows and a plurality of columns in each block 104. One row of memory cells 106 corresponds to one or more pages 120, and one column of memory cells corresponds to one NAND memory string 108, according to some implementations. The plurality of rows of memory cells 106 can be respectively coupled to word lines 118, and the plurality of columns of memory cells 106 can be respectively coupled to bit lines 116. Peripheral circuit 102 can be coupled to memory cell array 101 through bit lines 116 and word lines 118.

Figure 2:
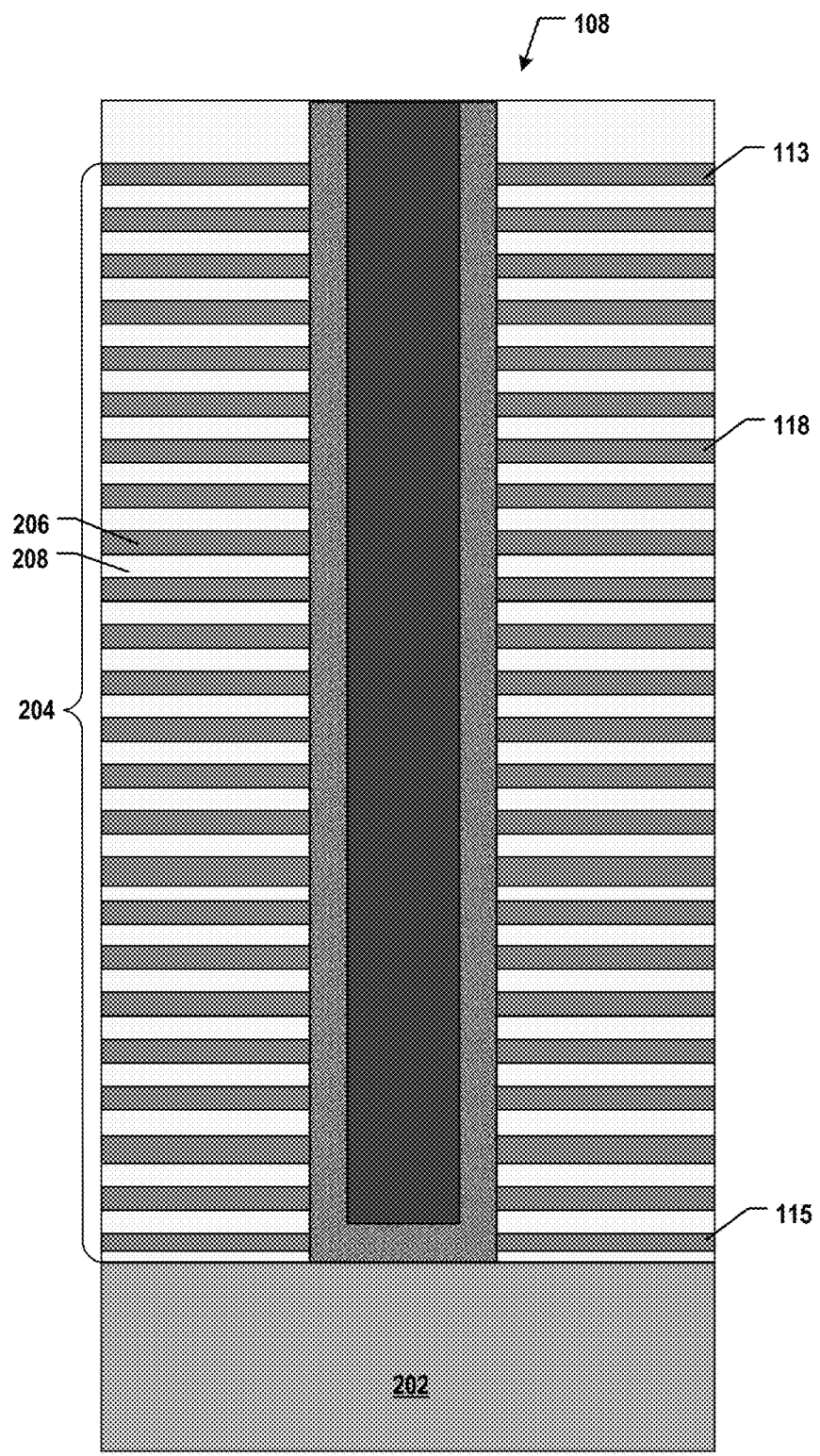
FIG. 2 illustrates a side view of a cross-section of a memory cell array including a NAND memory string, according to some aspects of the present disclosure.

FIG. 2 illustrates a side view of a cross-section of memory cell array 101 including NAND memory string 108, according to some aspects of the present disclosure. As shown in FIG. 2, NAND memory string 108 can extend vertically through a memory stack 204 above a substrate 202. Substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

Memory stack 204 can include interleaved gate conductive layers 206 and gate-to-gate dielectric layers 208. The number of the pairs of gate conductive layers 206 and gate-to-gate dielectric layers 208 in memory stack 204 can determine the number of memory cells 106 in memory cell array 101. Gate conductive layer 206 can include conductive materials including, but not limited to, tungsten (W), cobalt (Co), copper (Cu), aluminum (Al), polysilicon, doped silicon, silicides, or any combination thereof. In some implementations, each gate conductive layer 206 includes a metal layer, such as a tungsten layer. In some implementations, each gate conductive layer 206 includes a doped polysilicon layer. Each gate conductive layer 206 can include control gates surrounding memory cells 106, the gates of DSG transistors 112, or the gates of SSG transistors 110, and can extend laterally as DSG line 113 at the top of memory stack 204, SSG line 115 at the bottom of memory stack 204, or word line 118 between DSG line 113 and SSG line 115.

As shown in FIG. 2, NAND memory string 108 includes a channel structure extending vertically through memory stack 204. In some implementations, the channel structure includes a channel hole filled with semiconductor material(s) (e.g., as a semiconductor channel) and dielectric material(s) (e.g., as a memory film). It is understood that although not shown in FIG. 2, additional components of memory cell array 101 can be formed including, but not limited to, gate line slits/source contacts, local contacts, interconnect layers, etc.

Figure 3:
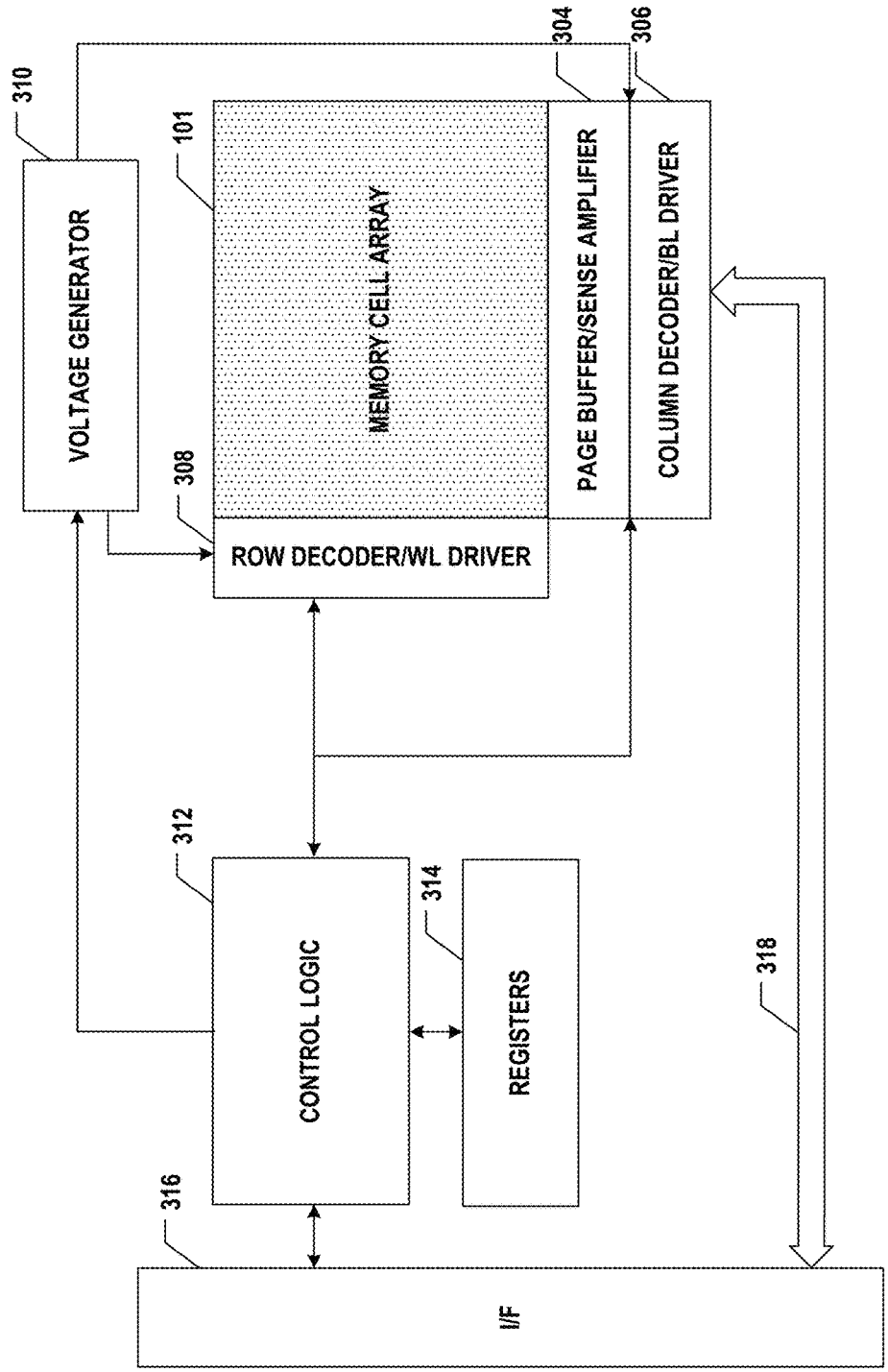
FIG. 3 illustrates a block diagram of a memory device including a memory cell array and peripheral circuits, according to some aspects of the present disclosure.

Referring back to FIG. 1, peripheral circuits 102 can be coupled to memory cell array 101 through bit lines 116, word lines 118, source lines 114, SSG lines 115, and DSG lines 113. Peripheral circuits 102 can include any suitable analog, digital, and mixed-signal circuits for facilitating the operations of memory cell array 101 by applying and sensing voltage signals and/or current signals to and from each select memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies. For example, FIG. 3 illustrates some exemplary peripheral circuits including a page buffer/sense amplifier 304, a column decoder/bit line driver 306, a row decoder/word line driver 308, a voltage generator 310, control logic 312, registers 314, an interface (I/F) 316, and a data bus 318. It is understood that in some examples, additional peripheral circuits not shown in FIG. 3 may be included as well.

Page buffer/sense amplifier 304 can be configured to sense (read) and program (write) data from and to memory cell array 101 according to the control signals from control logic 312. In one example, page buffer/sense amplifier 304 may store one page of program data (write data, referred to herein as "data page") to be programmed into one page 120 of memory cell array 101. In another example, page buffer/sense amplifier 304 may verify programmed select memory cells 106 in each program/verify loop in a program operation to ensure that the data has been properly programmed into memory cells 106 coupled to select word lines 118. In still another example, page buffer/sense amplifier 304 may also sense the low power signals from bit line 116 that represents a data bit stored in memory cell 106 and amplify the small voltage swing to recognizable logic levels in a read operation.

Column decoder/bit line driver 306 can be configured to be controlled by control logic 312 and select one or more NAND memory strings 108 by applying bit line voltages generated from voltage generator 310. Row decoder/word line driver 308 can be configured to be controlled by control logic 312 and select/deselect blocks 104 of memory cell array 101 and select/deselect word lines 118 of block 104. Row decoder/word line driver 308 can be further configured to drive word lines 118 using word line voltages generated from voltage generator 310. In some implementations, row decoder/word line driver 308 can also select/deselect and drive SSG lines 115 and DSG lines 113 as well. Voltage generator 310 can be configured to be controlled by control logic 312 and generate the word line voltages (e.g., read voltage, program voltage, channel pass voltage, local voltage, verify voltage, etc.), bit line voltages, and source line voltages to be supplied to memory cell array 101. As described below in detail and consistent with the scope of the present disclosure, in read operations, after the read phase, row decoder/word line driver 308 can discharge the word line voltage to a relatively high recovery voltage, i.e., greater than the supply voltage (Vdd), or even skip discharging the word line voltage, which can reduce or inhibit charge loss between adjacent word lines, thereby improving device reliability and read efficiency.

Control logic 312 can be coupled to each peripheral circuit described above and configured to control the operations of each peripheral circuit. Registers 314 can be coupled to control logic 312 and include status registers, command registers, and address registers for storing status information, command operation codes (OP codes), and command addresses for controlling the operations of each peripheral circuit. Interface 316 can be coupled to control logic 312 and act as a control buffer to buffer and relay control commands received from a memory controller (not shown) and/or a host (not shown) to control logic 312 and status information received from control logic 312 to the memory controller and/or the host. Interface 316 can also be coupled to column decoder/bit line driver 306 via data bus 318 and act as a data input/output (I/O) interface and a data buffer to buffer and relay the data to and from memory cell array 101.

Figure 4:
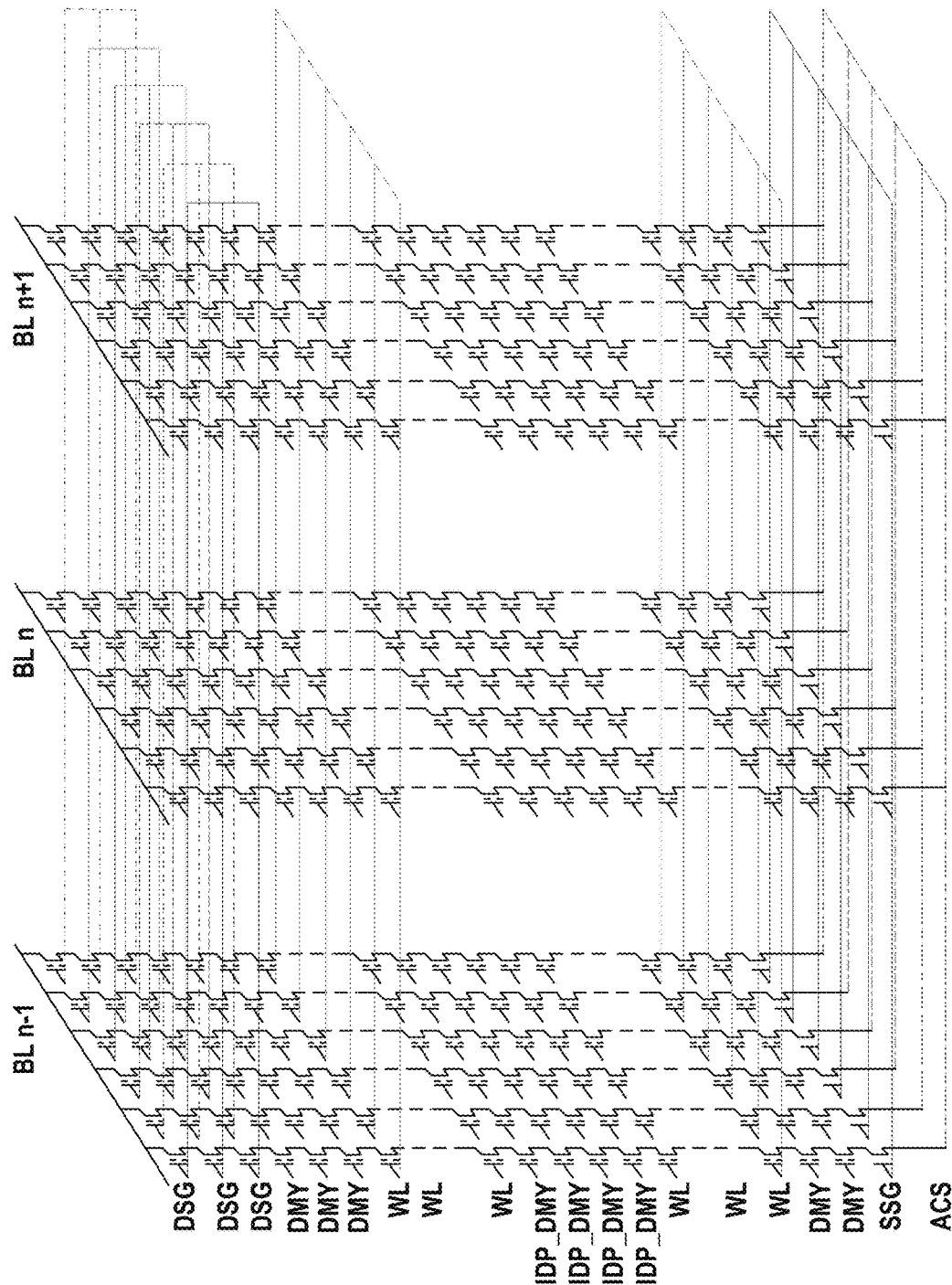
FIG. 4 illustrates a perspective schematic diagram of three-dimensional (3D) NAND memory strings, according to some aspects of the present disclosure.

FIG. 4 illustrates a perspective schematic diagram of 3D NAND memory strings, according to some aspects of the present disclosure. FIG. 4 shows an example of an array of 3D NAND memory strings (e.g., 108 in FIG. 1) in a block (e.g., 104 in FIG. 1). As shown in FIG. 4, from top to bottom, each 3D NAND memory string is coupled to a number of lines in different rows, e.g., DSG lines (DSGs, e.g., 113 in FIG. 1), dummy DSG lines (DMYs), word lines in the upper deck of the memory stack (WLs, e.g., 118 in FIG. 1), inter-deck dummy word lines (IDP-DMYs), word lines in the lower deck of the memory stack (WLs, e.g., 118 in FIG. 1), dummy SSG lines (DMYs), SSG line (SSG, e.g., 115 in FIG. 1), and array common source line (ACS, e.g., 114 in FIG. 1). Read operations can be performed between memory cells in different rows from bottom to top (i.e., in the direction from ACS to DSG), or vice versa (e.g., in the direction from DSG to ACS).

Figure 5:
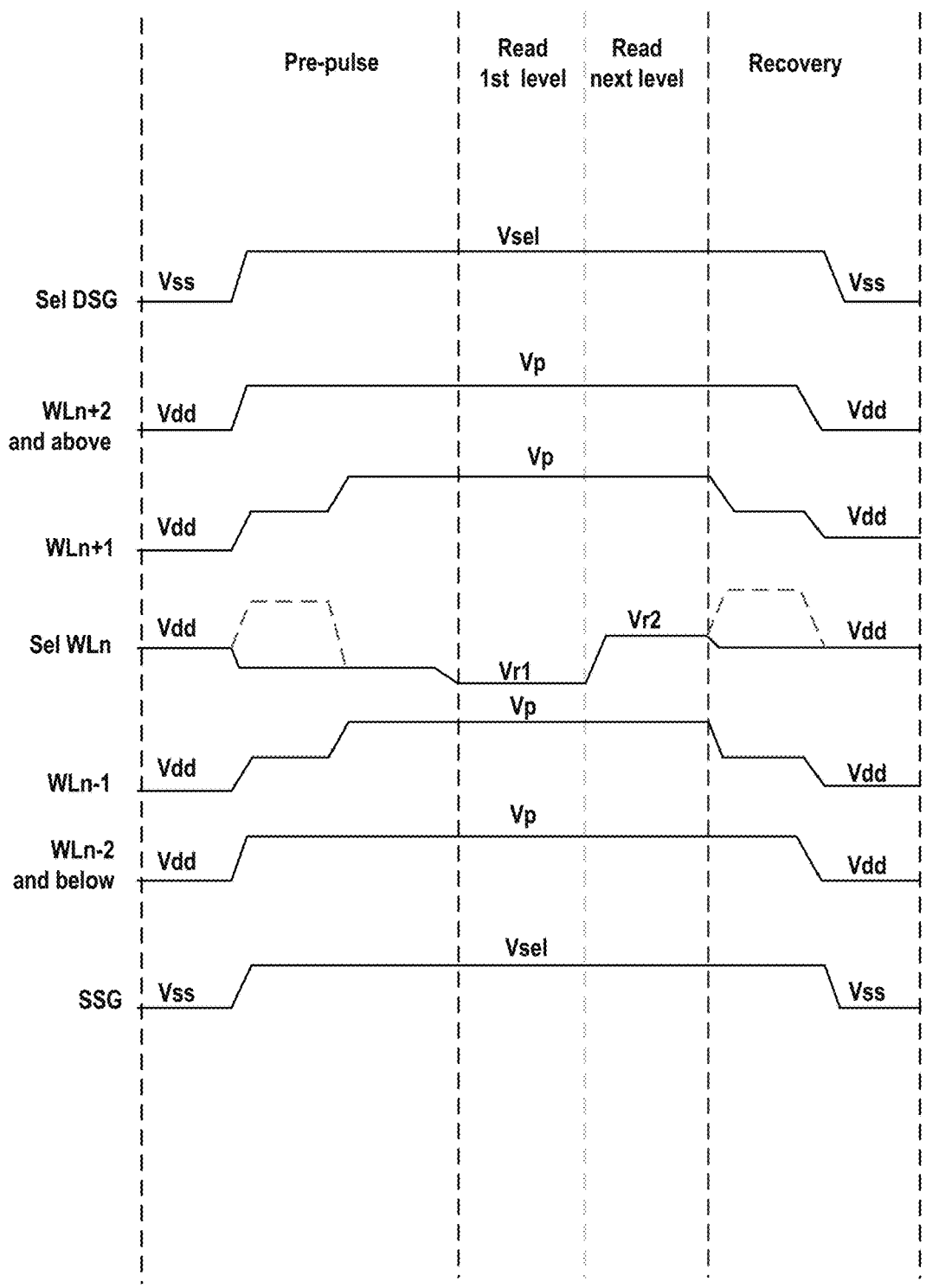
FIG. 5 illustrates a timing diagram of a read operation with a recovery phase.

FIG. 5 illustrates a timing diagram of a read operation with a recovery phase. As shown in FIG. 5, a read operation includes a pre-pulse phase, one or more read phases (e.g., Read 1st level, Read next level, etc.), and a recovery phase. During the pre-pulse phase, peripheral circuit 102 is configured to control select NAND memory strings to be ready for reading. For example, word line driver 308 is configured to charge the select DSG line (Sel DSG) and the SSG line (SSG) from a supply voltage (Vss) to a select voltage (Vsel) that can turn on the DSG transistors and the SSG transistors of the select NAND memory strings coupled to the select DSG line and the SSG line, respectively. Word line driver 308 is also configured to charge/discharge the select word line n (Sel WLn) from a supply voltage (Vdd) to a first read voltage (Vr1). The select word line n is coupled to the row of memory cells 106 to be read (select memory cells) during the read operation. Word line driver 308 is also configured to charge the unselect word lines (WLn−1, WLn−2 and below, WLn+1, and WLn+2 and above) from a supply voltage (Vdd) to a pass voltage (Vp) that can turn on memory cells 106 coupled to the unselect word lines (unselect memory cells). That is, at the end of the pre-pulse phase, in the select NAND memory strings, DSG transistors, SSG transistors, and unselect memory cells are all turned on by peripheral circuit 102.

During each of the read phases, peripheral circuit 102 is configured to keep turning on the DSG transistors, SSG transistors, and unselect memory cells in the select NAND memory strings and apply a respective read voltage to the select memory cells in the select NAND memory string. For example, word line driver 308 is configured to apply the select voltage to the select DSG line and the SSG line, and apply the pass voltage to the unselect word lines when reading the first and next levels in the first and second read phases. Word line driver 308 is further configured to apply the first read voltage to the select word line n when reading the first level in the first read phase, and then apply a second read voltage (Vr2) to the select word line n when reading the next level in the second read phase.

During the recovery phase, peripheral circuit 102 is configured to control the select NAND memory strings to recover from reading and be ready for the next operation. For example, word line driver 308 is configured to discharge the select DSG line and the SSG line from the select voltage back to the supply voltage (Vss) to turn off the DSG transistors and the SSG transistors, respectively. Word line driver 308 is also configured to discharge the select word line n from the last read voltage (e.g., the second read voltage in FIG. 5) back to the supply voltage (Vdd). Word line driver 308 is further configured to discharge the unselect word lines from the pass voltage back to the supply voltage (Vdd). It is understood that during the recovery phase, the voltage on the select word line n may be coupled to be the same as the voltage on the unselect word lines that are immediately adjacent to the select word line n (WLn+1 and WLn−1), as shown in the dotted line in FIG. 5. The same phenomenon may be viewed during the pre-pulse phase as well.

In any event, at the end of the recovery phase, the word line voltages are all recovered back to the supply voltage (Vdd), as shown in FIG. 5. However, such a relatively low residual voltage (e.g., Vdd) at the end of the read operation may not be sufficient to prevent the migration of charges between adjacent word lines, which can affect the short-term and long-term reliability of the memory device. It also takes a relatively long time to discharge the word lines to the supply voltage, thereby increasing the duration of the read operation.

Consistent with the scope of the present disclosure, read operations with a shortened recovery phase or without a recovery phase implemented using memory devices disclosed herein (e.g., memory device 100) are described below in detail. It is understood that the schemes disclosed herein are not limited to read operations and may be similarly applied to the verification process during program operations as well.

Figure 6:
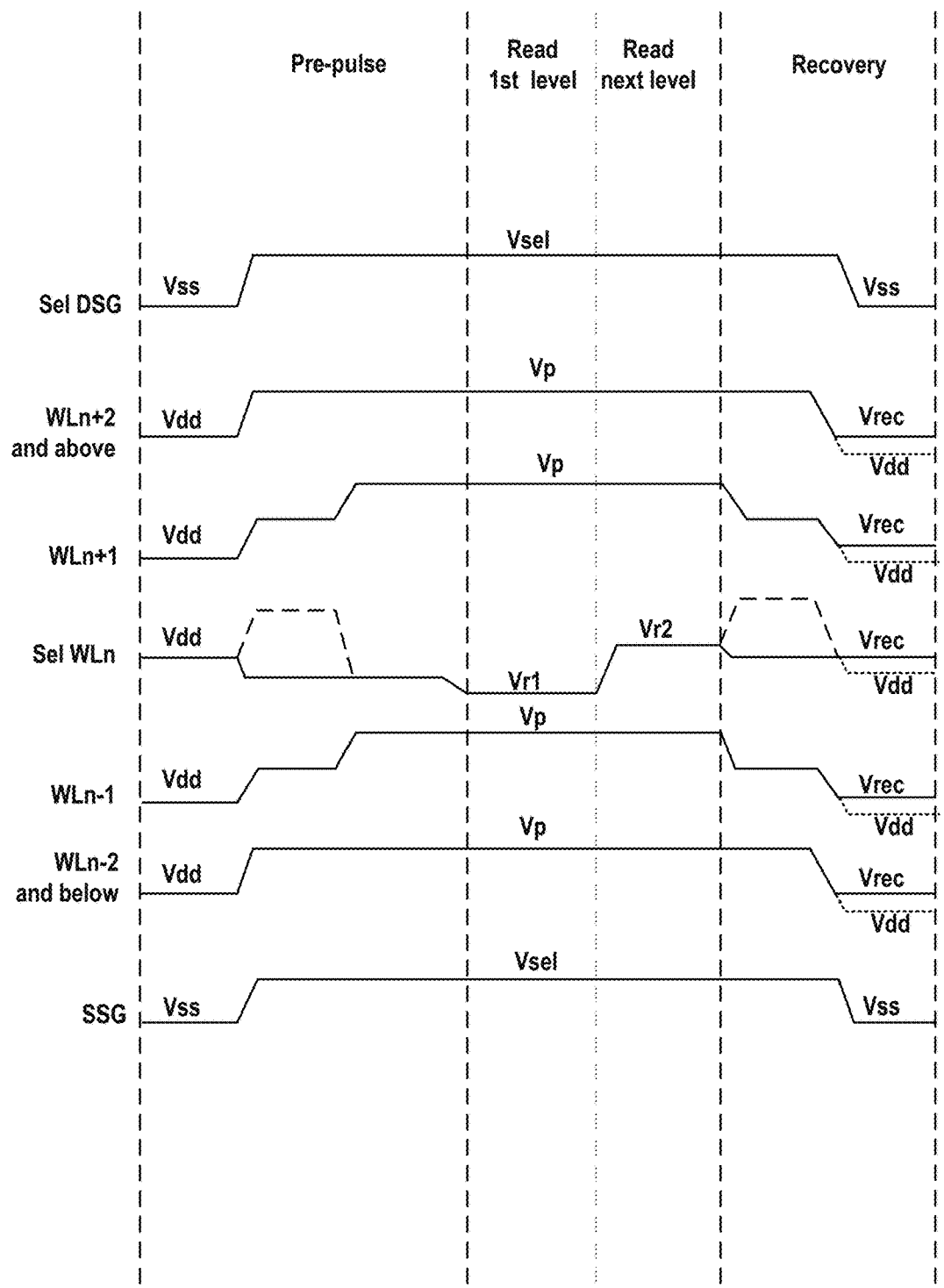
FIG. 6 illustrates a timing diagram of a read operation with a shortened recovery phase, according to some aspects of the present disclosure.

FIG. 6 illustrates a timing diagram of a read operation with a shortened recovery phase, according to some aspects of the present disclosure. As shown in FIG. 6, a read operation includes a pre-pulse phase, one or more read phases (e.g., Read 1st level, Read next level, etc.) and a shortened recovery phase compared with the recovery phase in FIG. 5. During the pre-pulse phase, peripheral circuit 102 is configured to control select NAND memory strings to be ready for reading. For example, word line driver 308 may be configured to charge the select DSG line (Sel DSG) and the SSG line (SSG) from a supply voltage (Vss) to a select voltage (Vsel) that can turn on the DSG transistors and the SSG transistors of the select NAND memory strings coupled to the select DSG line and the SSG line, respectively. It is understood that in some examples, the select voltage on the select DSG line may be different from the select voltage on the SSG line. Word line driver 308 may also be configured to charge/discharge the select word line n (Sel WLn) from a supply voltage (Vdd) to a first read voltage (Vr1). The select word line n may be coupled to the row of memory cells 106 to be read (select memory cells) during the read operation. Depending on whether the first read voltage is higher or lower than the supply voltage, word line driver 308 may either charge the select word line n or discharge the select word line n during the pre-pulse phase. It is understood that during the pre-pulse phase, the voltage on the select word line n may be coupled to be the same as the voltage on the unselect word lines that are immediately adjacent to the select word line n (WLn+1 and WLn−1), as shown in the dotted line in FIG. 6. Word line driver 308 may be further configured to charge the unselect word lines (WLn−1, WLn−2 and below, WLn+1, and WLn+2 and above) from a supply voltage (Vdd) to a pass voltage (Vp) that can turn on memory cells 106 coupled to the unselect word lines (unselect memory cells). It is understood that in some examples, the pass voltage on the unselect word lines that are immediately adjacent to the select word line n (WLn+1 and WLn−1) may be different from (e.g., higher than as shown in FIG. 6) the pass voltage on other unselect word lines (WLn−2 and below, and WLn+2 and above). In any event, at the end of the pre-pulse phase, in the select NAND memory strings, DSG transistors, SSG transistors, and unselect memory cells may all be turned on by peripheral circuit 102.

During each of the read phases, peripheral circuit 102 may be configured to keep turning on the DSG transistors, SSG transistors, and unselect memory cells in the select NAND memory strings and apply a respective read voltage to the select memory cells in the select NAND memory string. For example, word line driver 308 may be configured to apply the select voltage to the select DSG line and the SSG line, and apply the pass voltage to the unselect word lines when reading the first and next levels in the first and second read phases. Word line driver 308 may be further configured to apply the first read voltage to the select word line n when reading the first level in the first read phase, and then apply a second read voltage (Vr2) to the select word line n when reading the next level in the second read phase.

During the recovery phase, peripheral circuit 102 may be configured to control the select NAND memory strings to recover from reading and be ready for the next operation. For example, word line driver 308 may be configured to discharge the select DSG line and the SSG line from the select voltage back to the supply voltage (Vss) to turn off the DSG transistors and the SSG transistors, respectively. Word line driver 308 may also be configured to discharge the unselect word lines from the pass voltage to a recovery voltage (Vrec) that is greater than the supply voltage (Vdd). Similarly, word line driver 308 may be further configured to discharge the select word line n from the last read voltage (e.g., the second read voltage in FIG. 6) voltage to a recovery voltage (Vrec) that is greater than the supply voltage (Vdd). That is, at the end of the recovery phase in FIG. 6, the word line voltages are not recovered back to the supply voltage, but instead to a recovery voltage that is greater than the supply voltage, according to some implementations. By increasing the residual word line voltages from the supply voltage at the end of the read operations, the migration of charges between adjacent word lines can be reduced or inhibited, thereby improving short-term and long-term reliability. Moreover, since the word line voltages are discharged to a higher voltage, compared with the supply voltage, the duration of the recovery phase can be reduced, and the read efficiency can be improved as well.

The recovery voltages on different word lines can be different. In some implementations, word line driver 308 is configured to discharge the unselect word lines that are immediately adjacent to the select word line n (WLn−1 and WLn+1) from the pass voltage to a first recovery voltage, and discharge the select word line n (Sel WLn) from the last read voltage to a second recovery voltage different from the first recovery voltage. Since the read voltages are smaller than the pass voltage and word line driver 308 is configured to start discharging the select word line n and the unselect word lines that are immediately adjacent to the select word line n at the same time, the second recovery voltage is smaller than the first recovery voltage, according to some implementations. It is understood that during the recovery phase, the voltage on the select word line n may be coupled to be the same as the voltage on the unselect word lines that are immediately adjacent to the select word line n, as shown in the dotted line in FIG. 6.

Various approaches can be applied by peripheral circuit 102 to discharge the word line voltages to a recovery voltage greater than the supply voltage. In some implementations, control logic 312 is configured to set a duration for word line driver 308 to discharge the select word line n and the unselect word lines, such that the word line voltages have not been discharged to the supply voltage. For example, the duration of the recovery phase in FIG. 6 (a shortened recovery phase) may be set to be smaller than the duration of the recovery phase in FIG. 5 such that there is not sufficient time for the word line voltages to drop to the supply voltage. In some implementations, control logic 312 is configured to set the recovery voltage (e.g., the first and second recovery voltages) for word line driver 308 to discharge the select word line n and the unselect word lines. For example, the recovery voltages in FIG. 6 may be set to be greater than the supply voltage, such that the discharging of the word line voltages by word line driver 308 stops when the word line voltages reach the recovery voltages before the supply voltage.

Figure 14:
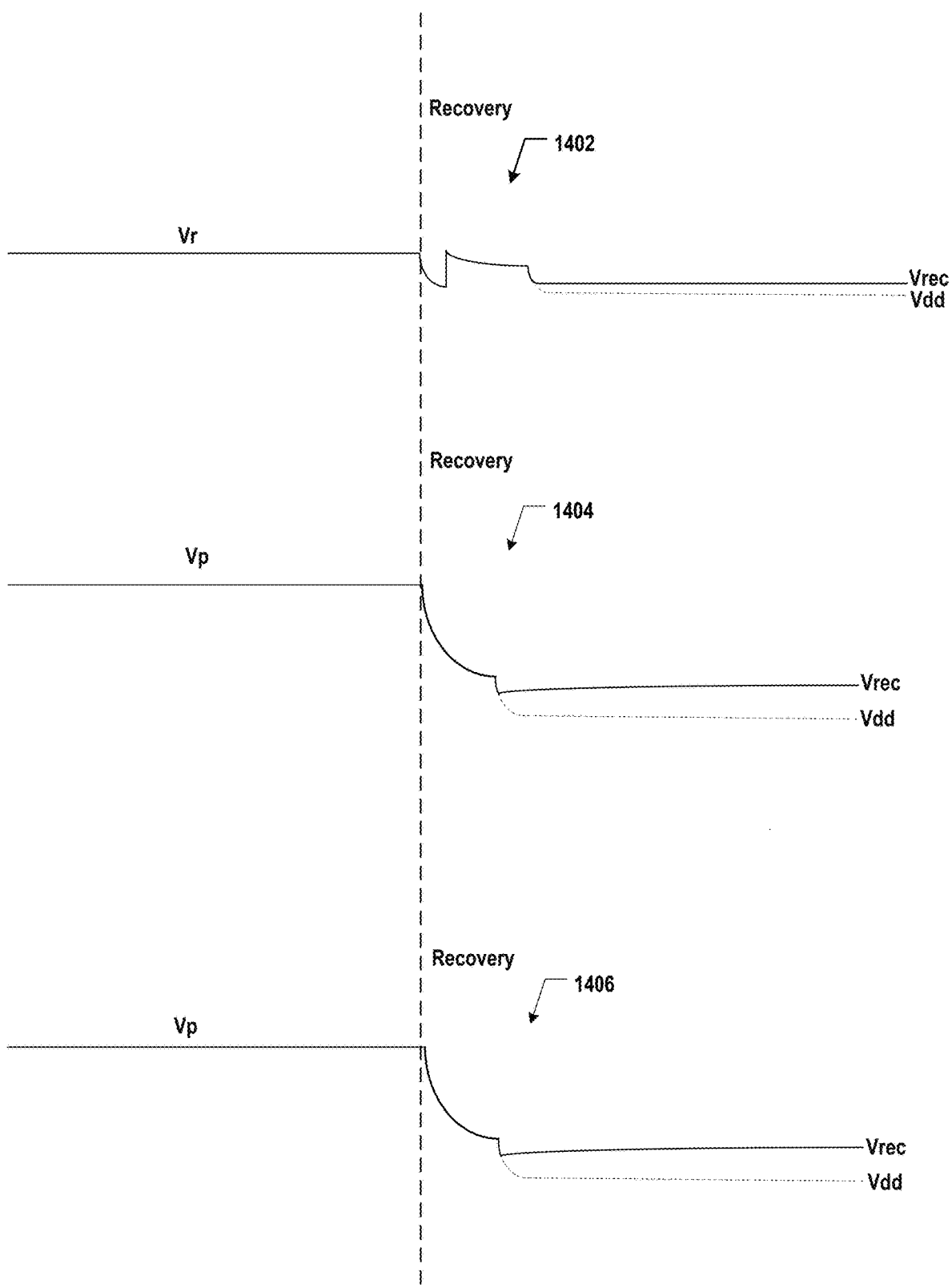
FIG. 14 illustrates examples of waveforms of word line voltages applied to a word line in read operations, according to some aspects of the present disclosure.

FIG. 14 illustrates examples of waveforms 1402, 1404, and 1406 of word line voltages applied to a word line in read operations, according to some aspects of the present disclosure. Waveforms 1402, 1404, and 1406 may correspond to the voltage line voltage applied to the same word line (e.g., WL 31) when the read operations are performed on different rows (i.e., the read voltage is applied to different word lines). For example, for waveform 1402, WL 31 may be the select word line and the read operation may be performed on the row of memory cells coupled to WL 31; for waveform 1404, WL 31 may be the unselect word line and the read operation may be performed on the row of memory cells coupled to WL 1; for waveform 1406, WL 31 may be the unselect word line and the read operation may be performed on the row of memory cells coupled to WL 45. In waveform 1402, during the recovery phase, select WL 31 may be discharged from a read voltage (Vr) to a recovery voltage (Vrec) that is greater than the supply voltage (Vdd). In each of waveform 1404 or 1406, during the recovery phase, unselect WL 31 may be discharged from a pass voltage (Vp) to a recovery voltage (Vrec) that is greater than the supply voltage (Vdd).

Figure 10:
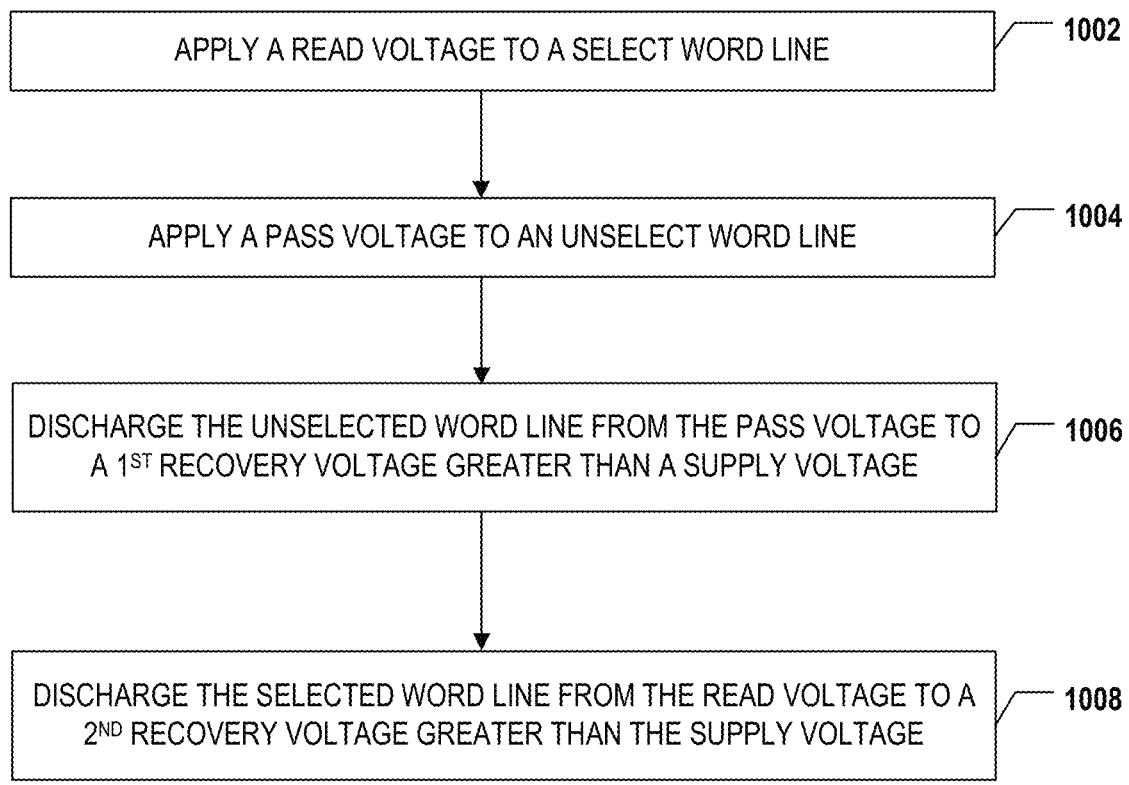
FIG. 10 illustrates a flowchart of a method for reading a memory device, according to some aspects of the present disclosure.

FIG. 10 illustrates a flowchart of a method 1000 for reading a memory device, according to some aspects of the present disclosure. The memory device may be any suitable memory device disclosed herein, such as memory device 100. Method 1000 may be implemented by peripheral circuit 102, such as word line driver 308 and control logic 312. It is understood that the operations shown in method 1000 may not be exhaustive and that other operations can be performed as well before, after, or between any of the illustrated operations. Further, some of the operations may be performed simultaneously, or in a different order than shown in FIG. 10. Method 1000 in FIG. 10 will be described with reference to the timing diagram of FIG. 8.

Referring to FIG. 10, a read voltage is applied to a select word line at 1002, and a pass voltage is applied to an unselect word line at 1004. In some implementations, the unselect word line is immediately adjacent to the select word line. For example, in FIG. 8, read voltages corresponding to level 1 (L1) and level 5 (L5) may be applied by word line driver 308 to the select word line (WL2) between T2 and T3 (the read phase); at the same time between T2 and T3, a pass voltage greater than the read voltages may be applied to each of unselect word line immediately adjacent to the select word line (WL1 and WL3).

Referring to FIG. 10, the unselect word line is discharged from the pass voltage to a first recovery voltage greater than a supply voltage of the memory device at 1006, and the select word line is discharged from the read voltage to a second recovery voltage greater than the supply voltage of the memory device at 1008. In some implementations, the second recovery voltage is smaller than the first recovery voltage. In some implementations, discharging the select word line and the unselect word line starts at the same time. In some implementations, the duration to discharge the unselect word line is set. In some implementations, the first recovery voltage to discharge the unselect word line is set.

Figure 7:
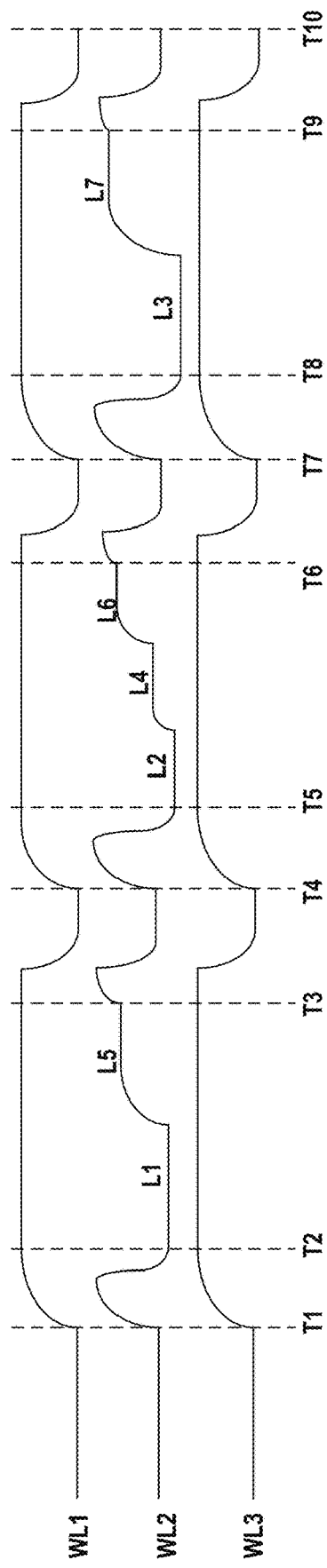
FIG. 7 illustrates a timing diagram of a read operation with a recovery phase.
Figure 8:
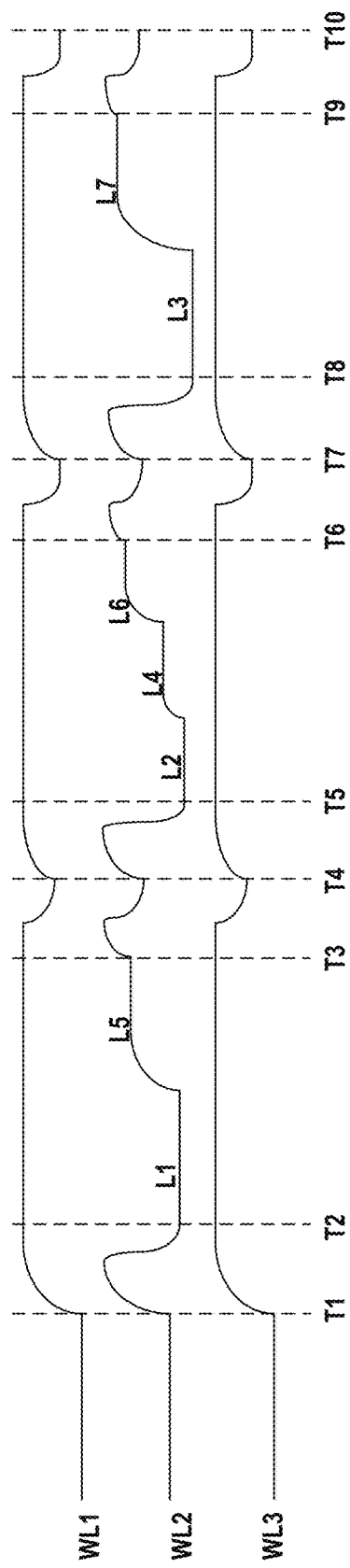
FIG. 8 illustrates a timing diagram of a read operation with a shortened recovery phase, according to some aspects of the present disclosure.

For example, in FIG. 8, the unselect word lines (WL1 and WL3) may be discharged by word line driver 308 from the pass voltage at T3 to a first recovery voltage at T4; the select word line (WL2) may be discharged by word line driver 308 from the read voltage at level 5 (L5) at T3 to a second recovery voltage at T4. In contrast, in FIG. 7, the unselect word lines (WL1 and WL3) may be discharged by word line driver 308 from the pass voltage at T3 to the supply voltage (e.g., Vdd) at T4; the select word line (WL2) may be discharged by word line driver 308 from the read voltage at level 5 (L5) at T3 to the supply voltage at T4 as well. Comparing the examples in FIG. 7 and FIG. 8, the first and second recovery voltages in FIG. 8 are greater than the supply voltage in FIG. 7, and the time between T3 and T4 (e.g., the recovery phase) is shorter in FIG. 8 than that in FIG. 7. It is understood that between T3 and T4, the voltage on the select word line (WL2) may be coupled to become the same as the voltage on the unselect word lines (WL1 and WL3) before being discharged, as shown in FIGS. 7 and 8. In one example, control logic 312 may set the time between T3 and T4, such that T4 in FIG. 8 occurs earlier than T4 in FIG. 7, forming a shortened recovery phase between T3 and T4 in FIG. 8 compared with the recovery phase between T3 and T4 in FIG. 7. In another example, control logic 312 may set the first recovery voltage and/or the second recovery voltage such that the discharging of the word line voltages stops when reaching the recovery voltages and before reaching the supply voltage.

FIGS. 7 and 8 illustrate examples in which memory cells of the memory device are TLCs that can be programmed into eight levels by three pages of data. Thus, in some implementations, three read operations are performed in sequence to read at different levels (e.g., L1 and L5 in the first read operation, L2, L4, and L6 in the second read operation, and L3 and L7 in the third operation as shown in FIGS. 7 and 8). Nevertheless, the same read operation scheme with a shortened recovery phase (e.g., between T3 and T4) may be applied to each of the three read operations, as shown in FIG. 8. For example, as shown in FIG. 8, after the end of the first read operation at T4, the second operation starts with a pre-pulse phase between T4 and T5, followed by read phases between T5 and T6, and a shortened recovery phase between T7 and T8. It is also understood that the same read operation scheme with a shortened recovery phase may be applied to any other type of memory cells, such as QLC.

Figure 11:
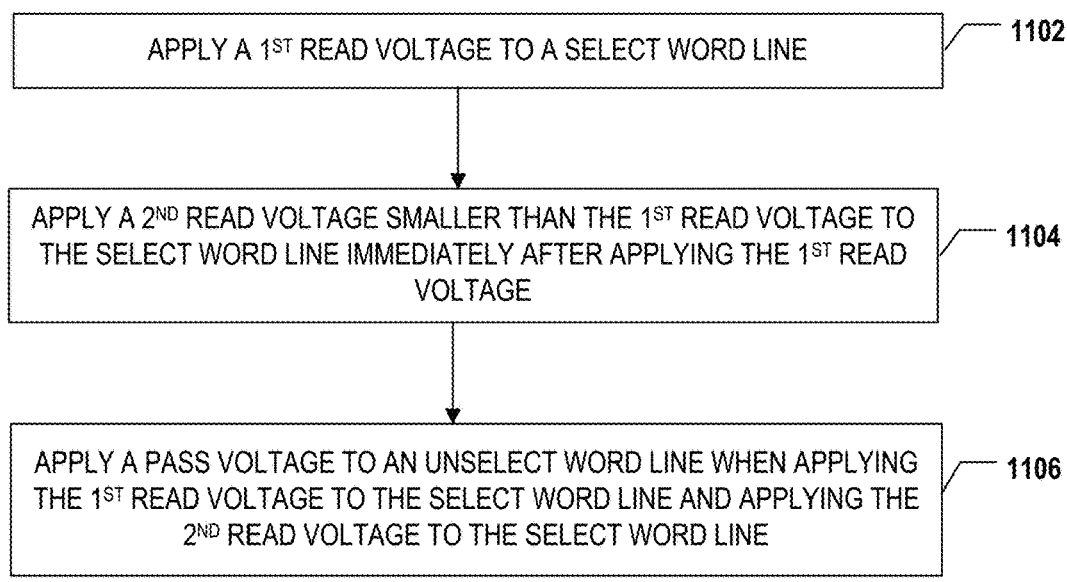
FIG. 11 illustrates a flowchart of another method for reading a memory device, according to some aspects of the present disclosure.

According to some aspects of the present disclosure, the recovery phase can be canceled completely to further reduce the read operation duration and increase the read efficiency. For example, FIG. 11 illustrates a flowchart of a method 1100 for reading a memory device, according to some aspects of the present disclosure. The memory device may be any suitable memory device disclosed herein, such as memory device 100. Method 1100 may be implemented by peripheral circuit 102, such as word line driver 308 and control logic 312. It is understood that the operations shown in method 1100 may not be exhaustive and that other operations can be performed as well before, after, or between any of the illustrated operations. Further, some of the operations may be performed simultaneously, or in a different order than shown in FIG. 11. Method 1000 in FIG. 10 will be described with reference to the timing diagram of FIG. 9.

Referring to FIG. 11, at 1102, a first read voltage is applied to a select word line. At 1104, a second read voltage smaller than the first read voltage is applied to the select word line immediately after applying the first read voltage. At 1106, a pass voltage is applied to an unselect word line when applying the first read voltage to the select word line and applying the second read voltage to the select word line. In some implementations, the unselect word line is immediately adjacent to the select word line. For example, in FIG. 9, a first set of read voltages corresponding to level 1 (L1) and level 5 (L5) may be applied by word line driver 308 to the select word line (WL2) between T2 and T3 (the read phase) in the first read operation. Immediately after the read phrase of the first read operation without any recovery phase, the second read operation may start to discharge the word line voltage on the select word line (WL2) from the last read voltage (L5) of the first set of read voltages at T3 to a read voltage corresponding to level 2 (L2) that is smaller than the last read voltage (L5) at T4. A second set of read voltages corresponding to level 2 (L2), level 4 (L4), and level 6 (L6) may be applied by word line driver 308 to the select word line (WL2) between T4 and T5 (the read phase) in the second read operation. Similarly, immediately after the read phrase of the second read operation without any recovery phase, the third read operation may start to discharge the word line voltage on the select word line (WL2) from the last read voltage (L6) of the second set of read voltages at T5 to a read voltage corresponding to level 3 (L3) that is smaller than the last read voltage (L6) at T6. A third set of read voltages corresponding to level 3 (L3) and level 7 (L7) may be applied by word line driver 308 to the select word line (WL2) between T6 and T7 (the read phase) in the third read operation. On the other hand, a pass voltage greater than the read voltages may be applied to each of unselect word lines immediately adjacent to the select word line (WL1 and WL3) when applying the first, second, and third sets of read voltages to the select word line (WL2) between T2 and T8. That is, the word line voltages on the unselect word line immediately adjacent to the select word line (WL1 and WL3) may be maintained at the pass voltage without being discharged during the read operations.

Figure 9:
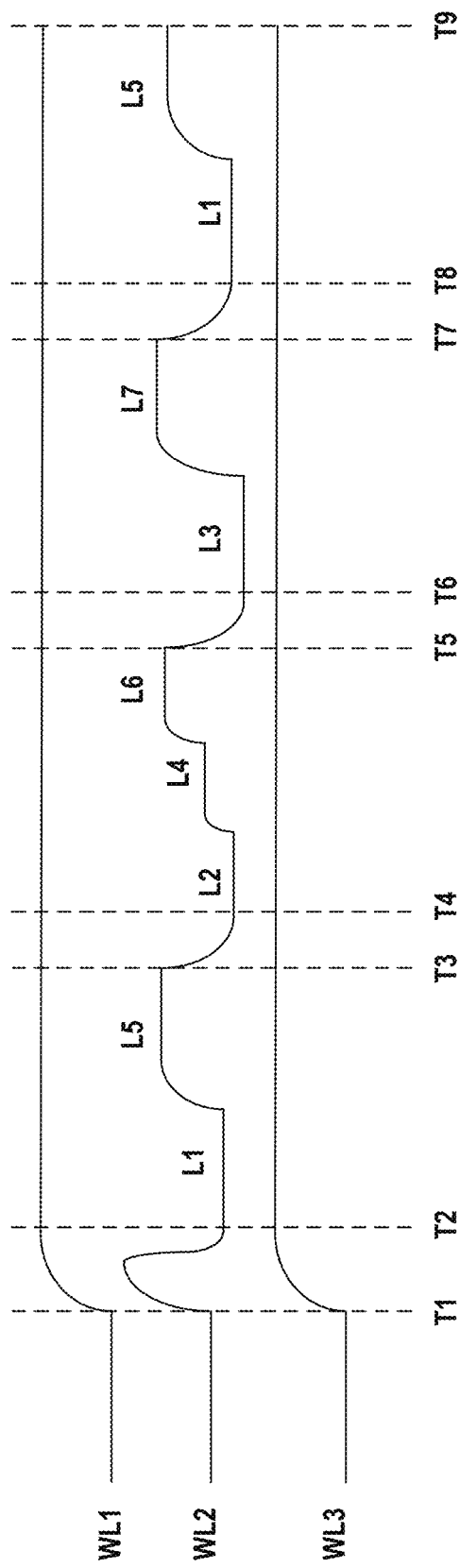
FIG. 9 illustrates a timing diagram of a read operation without a recovery phase, according to some aspects of the present disclosure.

FIG. 9 illustrates an example in which memory cells of the memory device are TLCs that can be programmed into eight levels by three pages of data. Thus, in some implementations, three read operations are performed in sequence to read at different levels (e.g., L1 and L5 in the first read operation, L2, L4, and L6 in the second read operation, and L3 and L7 in the third operation as shown in FIG. 9). Compared with the example in FIG. 7, recovery phase and pre-pulse phase are canceled from read operations. It is understood that the same read operation scheme without a recovery phase may be applied to any other type of memory cells, such as QLC.

Figure 12:
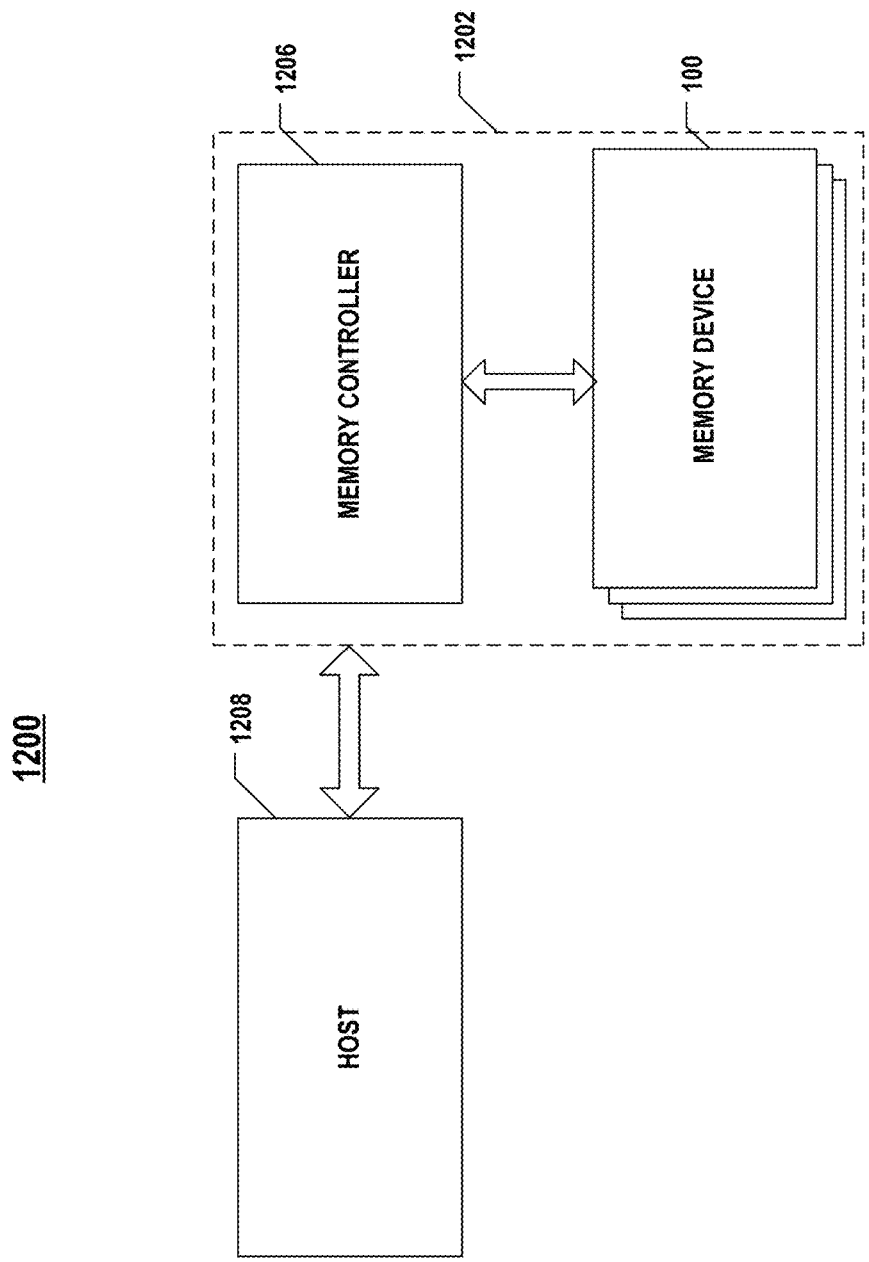
FIG. 12 illustrates a block diagram of a system having a memory device, according to some aspects of the present disclosure.

FIG. 12 illustrates a block diagram of a system 1200 having a memory device, according to some aspects of the present disclosure. System 1200 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 12, system 1200 can include a host 1208 and a memory system 1202 having one or more memory devices 100 (shown in FIG. 1) and a memory controller 1206. Host 1208 can be a processor of an electronic device, such as a central processing unit (CPU), or a system-on-chip (SoC), such as an application processor (AP). Host 1208 can be configured to send or receive data to or from memory devices 100.

Memory device 100 can be any memory device disclosed in the present disclosure. Memory controller 1206 is coupled to memory device 100 and host 1208 and is configured to control memory device 100, according to some implementations. Memory controller 1206 can manage the data stored in memory device 100 and communicate with host 1208. In some implementations, memory controller 1206 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1206 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1206 can be configured to control operations of memory device 100, such as read, erase, and program operations. Memory controller 1206 can also be configured to manage various functions with respect to the data stored or to be stored in memory device 100 including, but not limited to bad-block management, garbage collection, logical-to-physical address conversion, wear leveling, etc. In some implementations, memory controller 1206 is further configured to process error correction codes (ECCs) with respect to the data read from or written to memory device 100. Any other suitable functions may be performed by memory controller 1206 as well, for example, formatting memory device 100. Memory controller 1206 can communicate with an external device (e.g., host 1208) according to a particular communication protocol. For example, memory controller 1206 may communicate with the external device through at least one of various interface protocols, such as a USB protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 13A:
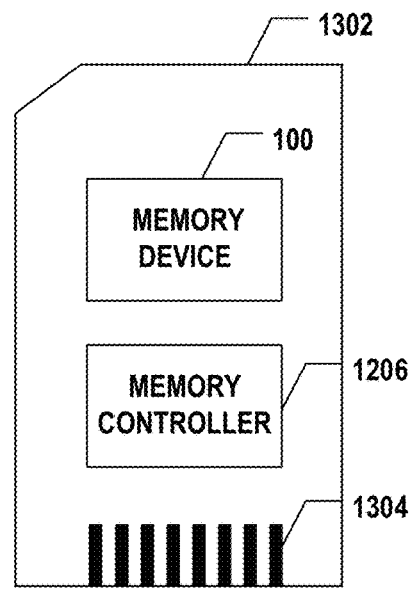
FIG. 13A illustrates a diagram of a memory card having a memory device, according to some aspects of the present disclosure.
Figure 13B:
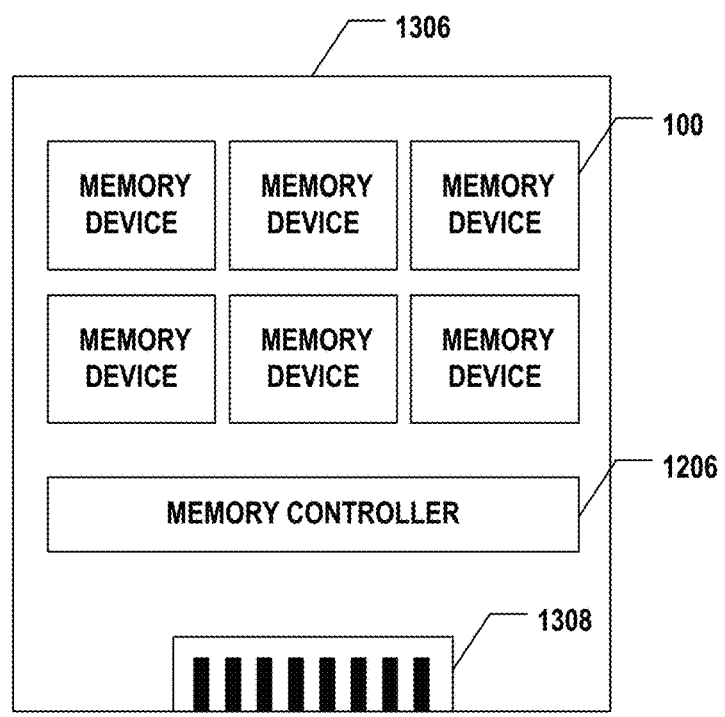
FIG. 13B illustrates a diagram of a solid-state drive (SSD) having a memory device, according to some aspects of the present disclosure.

Memory controller 1206 and one or more memory devices 100 can be integrated into various types of storage devices, for example, being included in the same package, such as a universal Flash storage (UFS) package or an eMMC package. That is, memory system 1202 can be implemented and packaged into different types of end electronic products. In one example as shown in FIG. 13A, memory controller 1206 and a single memory device 100 may be integrated into a memory card 1302. Memory card 1302 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 1302 can further include a memory card connector 1304 coupling memory card 1302 with a host (e.g., host 1208 in FIG. 12). In another example as shown in FIG. 13B, memory controller 1206 and multiple memory devices 100 may be integrated into an SSD 1306. SSD 1306 can further include an SSD connector 1308 coupling SSD 1306 with a host (e.g., host 1208 in FIG. 12). In some implementations, the storage capacity and/or the operation speed of SSD 1306 is greater than those of memory card 1302.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

Although specific configurations and arrangements are discussed, it should be understood that this is done for illustrative purposes only. As such, other configurations and arrangements can be used without departing from the scope of the present disclosure. Also, the subject matter as described in the present disclosure can also be used in a variety of other applications. Functional and structural features as described in the present disclosures can be combined, adjusted, modified, and rearranged with one another and in ways that are consistent with the scope of the present disclosure.

What is claimed is:

1. A memory device, comprising:
   an array of memory cells;
   word lines respectively coupled to rows of the memory cells; and
   a peripheral circuit coupled to the array of memory cells through the word lines
      and configured to, in a read operation on a select row of the rows of memory cells coupled to a select word line of the word lines:
      apply a pass voltage to an unselect word line of the word lines; and
      discharge the unselect word line from the pass voltage to a first recovery voltage that is greater than a supply voltage of the array of memory cells, comprising stopping discharging the unselect word line before a potential of the unselect word line reaches the supply voltage.

2. The memory device of claim 1, wherein the peripheral circuit is further configured to:
   apply a read voltage to the select word line; and
   discharge the select word line from the read voltage to a second recovery voltage that is greater than the supply voltage.

3. The memory device of claim 2, wherein the second recovery voltage is smaller than the first recovery voltage.

4. The memory device of claim 2, wherein the unselect word line is immediately adjacent to the select word line.

5. The memory device of claim 4, wherein the peripheral circuit is configured to start discharging the select word line and the unselect word line at a same time.

6. The memory device of claim 1, wherein the peripheral circuit comprises a word line driver configured to apply the pass voltage to the unselect word line and control logic coupled to the word line driver and configured to set a duration for the word line driver to discharge the unselect word line.

7. The memory device of claim 1, wherein the peripheral circuit comprises a word line driver configured to apply the pass voltage to the unselect word line and control logic coupled to the word line driver and configured to set the first recovery voltage for the word line driver to discharge the unselect word line.

8. The memory device of claim 1, wherein the memory device is a three-dimensional (3D) NAND memory device.

9. A method for reading a memory device comprising memory cells, comprising, in a read operation on a select row of the memory cells coupled to a select word line:
   applying a pass voltage to an unselect word line coupled to an unselect row of the memory cells; and
   discharging the unselect word line from the pass voltage to a first recovery voltage that is greater than a supply voltage of the memory cells, comprising stopping discharging the unselect word line before a potential of the unselect word line reaches the supply voltage.

10. The method of claim 9, further comprising:
    applying a read voltage to the select word line coupled to the select row of the memory cells; and
    discharging the select word line from the read voltage to a second recovery voltage that is greater than the supply voltage.

11. The method of claim 10, wherein the second recovery voltage is smaller than the first recovery voltage.

12. The method of claim 10, wherein the unselect word line is immediately adjacent to the select word line.

13. The method of claim 12, wherein discharging the select word line and discharging the unselect word line are started at a same time.

14. The method of claim 9, further comprising setting a duration to discharge the unselect word line.

15. The method of claim 9, further comprising setting the first recovery voltage to discharge the unselect word line.

16. The method of claim 9, wherein the memory device is a three-dimensional (3D) NAND memory device.

17. A system, comprising:
    a memory device configured to store data, the memory device comprising:
       an array of memory cells;
       word lines respectively coupled to rows of the memory cells; and
       a peripheral circuit coupled to the array of memory cells through the word lines
          and configured to, in a read operation on a select row of the rows of memory cells coupled to a select word line of the word lines:
          apply a pass voltage to an unselect word line of the word lines; and
          discharge the unselect word line from the pass voltage to a first recovery voltage that is greater than a supply voltage of the array of memory cells, comprising stopping discharging the unselect word line before a potential of the unselect word line reaches the supply voltage; and
    a memory controller coupled to the memory device and configured to control the memory device.

18. The system of claim 17, wherein the peripheral circuit is further configured to:
    apply a read voltage to the select word line; and
    discharge the select word line from the read voltage to a second recovery voltage that is greater than the supply voltage.

19. The system of claim 18, wherein the second recovery voltage is smaller than the first recovery voltage.

20. The system of claim 18, wherein the unselect word line is immediately adjacent to the select word line.

* * * * *